United States Patent [19]

Berlant

[11] Patent Number: 4,496,021

[45] Date of Patent: Jan. 29, 1985

[54] 360 DEGREE RADIAL REFLEX ORTHOSPECTRAL HORN FOR HIGH-FREQUENCY LOUDSPEAKERS

[76] Inventor: Emmanuel Berlant, 5600 Kensington Way, #206, Culver City, Calif. 90230

[21] Appl. No.: 467,736

[22] Filed: Feb. 18, 1983

[51] Int. Cl.[3] .............................................. H05K 5/02

[52] U.S. Cl. .................................... 181/152; 181/159; 181/195

[58] Field of Search ............... 181/175, 152, 153, 159, 181/185, 189, 190, 191, 144, 145

[56] References Cited

U.S. PATENT DOCUMENTS

| | | | |
|---|---|---|---|
| 3,327,808 | 6/1967 | Shaper | 181/153 |
| 3,866,710 | 2/1975 | Cesati | 181/159 |

OTHER PUBLICATIONS

Sanial, "Graphs for Exponential Horn Designs," RCA Review, vol. III, No. 1, Jul. 1938, pp. 97–103.

Olson, "Horn Loud Speakers," RCA Review, vol. II, No. 2, Oct. 1937, pp. 265–277.

*Primary Examiner*—John Gonzales
*Assistant Examiner*—Brian W. Brown
*Attorney, Agent, or Firm*—Norman L. Chalfin

[57] ABSTRACT

A radial high-frequency, high-efficiency orthospectral loudspeaker is disclosed in which a horn-loaded, electro-acoustic driver is used and the horn configuration is radial and annular to give a 360° lateral dispersion of the sound generated by the loudspeaker, the output being frequency and amplitude equalized over the desired high frequency band.

13 Claims, 6 Drawing Figures

360 DEGREE RADIAL REFLEX ORTHOSPECTRAL HORN FOR HIGH-FREQUENCY LOUDSPEAKERS

FIELD OF THE INVENTION

This invention relates to high-frequency loudspeaker horn assemblies and more particularly to a radial reflex horn assembly in which a vertically oriented electro-acoustic high-frequency driving assembly is coupled to the horn assembly so as to provide a 360° reflexive dispersion of the high frequency acoustic or audio energy generated. The coupling between the driver and horn configuration is such that acoustic equalization is achieved over the high frequency audio band of operation of the horn. The dispersion of the sound energy generated is oriented normal to the axis of operation of the driver.

BACKGROUND OF THE INVENTION

In the nearly half century since the introduction of the long-playing low-noise vinyl phonograph record launched the high fidelity home music system industry, and the more than a quarter century since the stereophonic disc stimulated that industry to its present size and sophistication, despite all the improvements in the technology, even the best of home music systems does not yet carry the conviction of reality, the sense that the listener is present at an actual performance. Music as reproduced in the home is always recognized as sound emanating from loudspeakers. This failure in the listener's perception of reality can be ascribed to the fact that prior art loudspeaker systems, even those considered the best and most expensive, do not quite achieve a true sense of reality.

The failure to obtain the aural ambience of a live performance from sound fields reproduced in the home is due largely to a high level of directionality inherent in the design of prior art loudspeakers. This is a problem which is more acute as the bandpass of audio systems becomes better. The unquestioning acceptance of this shortcoming of prior art loudspeaker systems is due to the generally accepted specification of its performance; the axial anechoic frequency response, by which prior art systems are characterized. This has become the single most important factor in the marketing of loudspeaker systems for home reproduction.

The sound field generated at a live performance has two principal components: a direct field radiated from the performer directly to the listener (or microphones) and a reverberant field formed by reflections, primarily from the boundaries behind and to the sides of the performer. The direct field diminishes in intensity as the inverse of the square of the distance between the listener and the performer. The reverberant field establishes, by multiple reflections, a consistent level throughout the hall proportional to the intensity of the source. As the distance from the performer to the listener increases, the level of the direct field rapidly decreases, until it falls below the level of the reverberant field. In real life, the listener at a live performance is almost always in an area in which the reverberant field predominates over the direct field, and that reverberant field originates primarily from the same direction as the direct field and secondarily from surfaces near the listener, and it is delayed by approximately one millisecond for each foot of the reverberant field path length greater than the direct field path length. The listener subconsciously registers the time difference between the two fields, and from that difference two very important conclusions can be drawn:

First, the direction from which the sound orginates is determined by a phenomenon known to psychoacousticians as "The Precedent Effect." This stipulates that the first wave form in a toneburst establishes the direction of origin of the tone. This phenomenon provides us with the mechanism for stereophonic hearing. It is unambiguous until the intensity of the later arriving reverberant field is approximately ten times that of the first arriving direct soundfield.

Secondly, the aural ambience of the performance hall results from one's subconcious comparison of the direct and reverberant soundfields. It establishes for the listener an appreciation of the size of the hall and its acoustical texture and gives the listener an appreciation that the hall is filled or empty.

In theory, the microphone replaces the listener in the hall, and the loudspeaker reproduces exactly what the microphone "hears". At this point, the directionality of conventional loudspeakers creates problems which become worse as the frequencies go higher. A conventional loudspeaker system does not reproduce sound with the same distribution pattern that is derived from a live performance: it radiates energy in a directional pattern that varies with frequency, due to mass control of the driver at the higher frequencies.

The home listening room is, almost without exception, smaller than the site of the original performance. Such a room has its own aural ambience, made up of the direct sound field from the loudspeaker to the listener, and a reverberant sound field created by multiple reflections, primarily from the boundaries behind the listener instead of from behind the performer, as in the case of a live performance.

The psychoacoustic effect of this reversal of the apparent direction of the origin of the reverberant sound field is in the recognition that such field reversals are indicative of the sound of loudspeakers. This is one of the two major problems affecting our perception of reality in home music systems. The other one is the severe inadequacy of treble (high frequency) response in musical reproduction in the home listening room. A conventional loudspeaker system sold on the basis of a flat axial anechoic frequency response curve will actually achieve good high frequency performance only on axis in an anechoic, or reflection-free, environment. Prior art loudspeakers are actually used in home listening rooms which are not anechoic. They are invariably quasi-everberant, and integrate all the sound energy radiated into the room. The result is a performance that is more accurately depicted by a total energy frequency response curve in which there is a high frequency deficiency. The reason this high frequency deficiency exists is that mass control of the drivers causes audio energy to decrease when the force required to maintain output exceeds the magnetic flux available in the gap. Energy is maintained along the central axis but for all other angles the sound pressure level decreases rapidly. Sound played in a quasi-reverberant room-any room with floor, walls, and a ceiling-is integrated to its average level in the reverberant sound field. The reverberant sound field is much more intense than the direct sound field at normal listening distances. It therefore becomes evident that the directionality of conventional loudspeaker systems makes the achievement of a good balance between treble and mid-range or bass portions of the aural spectrum a virtual impossibility.

Clearly then, only a loudspeaker system which radiates all its acoustic energy equally along every radial axis throughout 360° in the horizontal plane will generate an aural ambience in which the reverberant sound field is formed by reflections originating primarily from the same direction as the source—from the boundaries behind the loudspeaker—and therefore the apparent source of the sound field is from the direction of the loudspeaker. This distribution is typically characteristic of the radial loudspeaker, and accounts for the superior spatial perspective of such systems.

An unconventional loudspeaker system that avoids the problems of distorted spatial perspective and spectral imbalance and which is capable of home music reproduction of sound that gives a listener the perception of reality—a conviction that he is present at an original performance—must have the following characteristics:

1. The sound energy from the loudspeaker system must be radiated equally on all axes through 360° in the horizontal plane.
2. Electroacoustic conversion efficiency must be relatively equal for all frequencies within the band-pass of the loudspeaker.
3. The loudspeaker system must be capable of relatively distortion-free reproduction when played at tutti-fortissimo orchestra levels in a listening room of the volume for which it has been designed.
4. The loudspeaker system must minimize distortions and coloration.

The 360° radial orthospectral tweeter assembly of this invention achieves the distribution of all its acoustic energy uniformly through 360° in the horizontal plane, and radiates that energy with effectively equal spectral efficiency. It is compact, cost effective, and extremely low in unwanted coloration.

The high frequency loudspeaker of this invention includes a unique application of horn-loading technology to a conventional dome diaphragm dynamic driver or ring driver. Lateral sound distribution in this invention is controlled by the use of a reflective wave-guide and provides virtually uniform efficiency by controlling the acoustic coupling between the mouth of the horn and its throat. It overcomes the decrease in total acoustic energy output at the higher frequencies characteristic of all prior art electroacoustic transducers, caused by the effects of mass control of the diaphragm. This acoustic equalization is possible because of the much higher conversion efficiency of the horn-loaded driver when compared to its direct-radiator equivalent.

A number of 360° horn devices were patented in the early years of radio. All are of pragmatic design and execution, obviously intended to provide a uniform sound field for a number of listeners sitting around a table mounted horn. In all devices of this type, the bending of the sound energy from the vertical axis of the flat diaphragm type driver to the horizontal plane was accomplished by refraction and diffraction. The loss of high frequency response in those older systems was immaterial because the program material lacked high frequencies. Later devices intended for the burgeoning public address systems market used horn configurations of significantly higher efficiency and acoustic power capability. But these also depended on refraction and diffraction to achieve dispersion. Their high frequency responses were adequate for the limited bandpass of the early public address systems.

In the present invention a format is created by which the higher frequencies are bent from the vertical axis of the driver to the horizontal plane for uniform polar distribution without loss of the higher frequencies. This is accomplished by using closely controlled reflection to effect the change of direction, rather than the refractive bending used in prior art horns. For a convex spherical dome used as a compression driver, the reflective means is an frusto-conical surface whose apex is on the central axis of the dome diaphragm.

The cross-sectional area of the throat of the horn is uniformly distributed around the vertical axis of the tweeter assembly. The upper surface of the horn is a frustoconical reflective surface upwardly angled from the inner edge of the throat diverging from the driver's central axis by half the difference between 90° and the throat's centerline divergence from that axis. This satisfies the requirement for undistorted reflection; the angle of incidence of a wave-front originating along the throat centerline is equal to the angle of reflection. The mouth of the horn, looking backward toward the throat, will "see" a virtual image of the throat at a distance behind the reflecting surface equal to the distance of the throat below that surface.

In the present invention a flare rate of the horn may be conical, or have manifold exponential sections resulting in a conical-like rate. This principle is used in a well-known prior art loudspeaker system to increase the efficiency at the top end of a folded exponential bass horn effected by using dual flare rates.

This principle is applied to the novel radial horn of the present invention but its scope and effect are more extensive. The flare rate must be calibrated to effect the degree and scope of equalization required to achieve uniform power response. The horn area must increase at the chosen rate of flare until the horn mouth area equals a circular horn whose diameter is one-quarter wavelength of the crossover frequency. The low frequency cutoff of the horn should be at a frequency slightly higher than the free-air resonance of the driver.

THE PRESENT INVENTION

In the field of loudspeakers for high fidelity reproduction of sound and music one of the most elusive factors, as has been described above, is the generation of the sound at the higher frequency end of the audible spectrum with linear frequency and amplitude characteristics over the selected high frequency range. Furthermore, to accomplish this with satisfactory efficiency has also proved difficult in the past. Added to this is the fact that there has been very little effort to provide an efficient high frequency loudspeaker system for 360° dispersion laterally and radially from the speaker.

In this invention a high-frequency loudspeaker system, sometimes referred to as a "tweeter" has been devised in which an electroacoustic high-frequency driver is positioned for vertical projection into a novel 360° horn configured to provide an equalizing impedance between the driver and the throat of the flared horn over the high frequency range of operation.

The horn throat and flared output portion to which it is coupled are both of annular configuration. Acoustic energy generated by the driver enters the horn throat through a ring shaped aperture expanding into a frusto-conical annular horn. The frusto-conical horn is coupled to a conical or multisection exponential flared horn the output axis of which is perpendicular to the axis of motion of the driver, providing the projection of the sound horizontally over 360°.

There are two basic configurations of audio frequency compression drivers suitable for use with horn loading. These are a dome driver employing either a convex or concave diaphragm and a ring radiator. Both of these electroacoustic drivers are known to the loudspeaker art.

The radial reflex acoustically equalized orthospectral horn structure of this invention is novel. Embodiments of the novel horn and driver combination are described in which both the domed and ring drivers are used.

The acoustic path of the sound energy from the horn throat to the mouth is a continuously expanding flare.

Accordingly, it is an object of this invention to provide a 360° radial acoustic horn-loaded high frequency loudspeaker which has uniform amplitude output response at all frequencies within its range.

It is another object to provide, in addition to a linear output in a 360° radial high-frequency horn loaded loudspeaker, an acoustically equalized response by means of a novel annular horn loading configuration.

It is still another object of this invention to provide an omnidirectional horn-loaded high frequency loudspeaker which occupies a minimal volume and permits a vertically operating driver to produce an output horizontally in all directions from the loudspeaker central axis with acoustic linearity and uniform frequency response over the operating frequency range of the loudspeaker.

These and other objects of this invention will become more clear from the specification describing the drawings which follow taken together with the appended claims.

IN THE DRAWINGS

Figure 2:
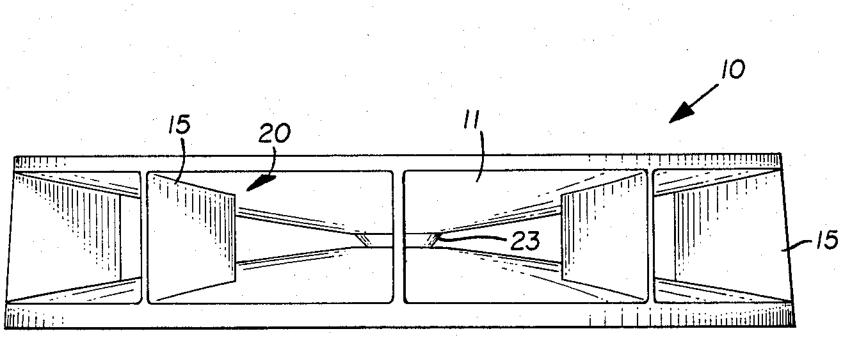
FIG. 2 is an elevation of the new radial-reflex loudspeaker shown in FIG. 1.
Figure 3A:
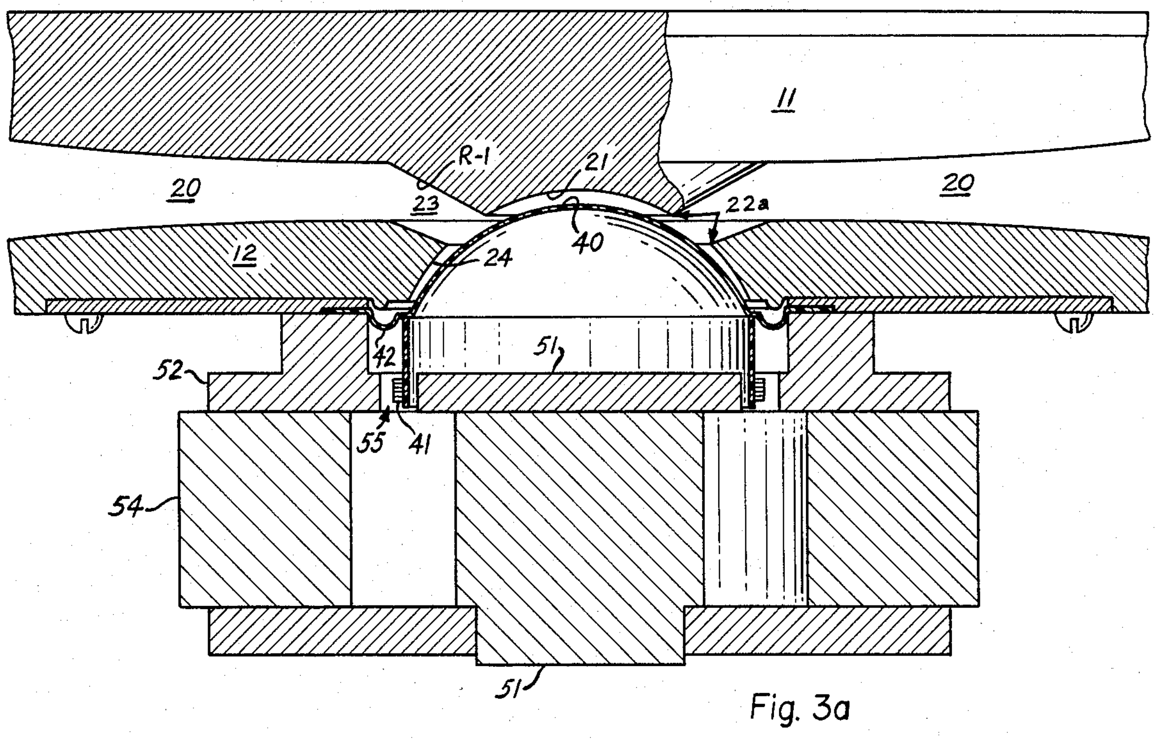
Figure 3B:
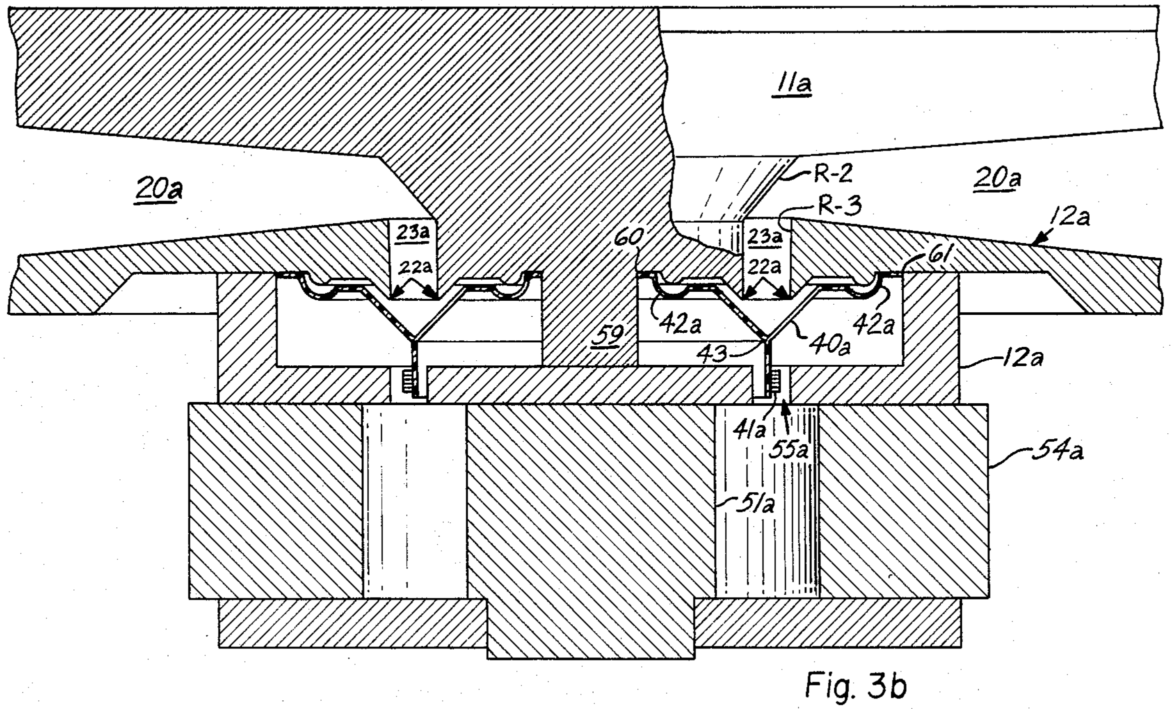
Figure 4A:
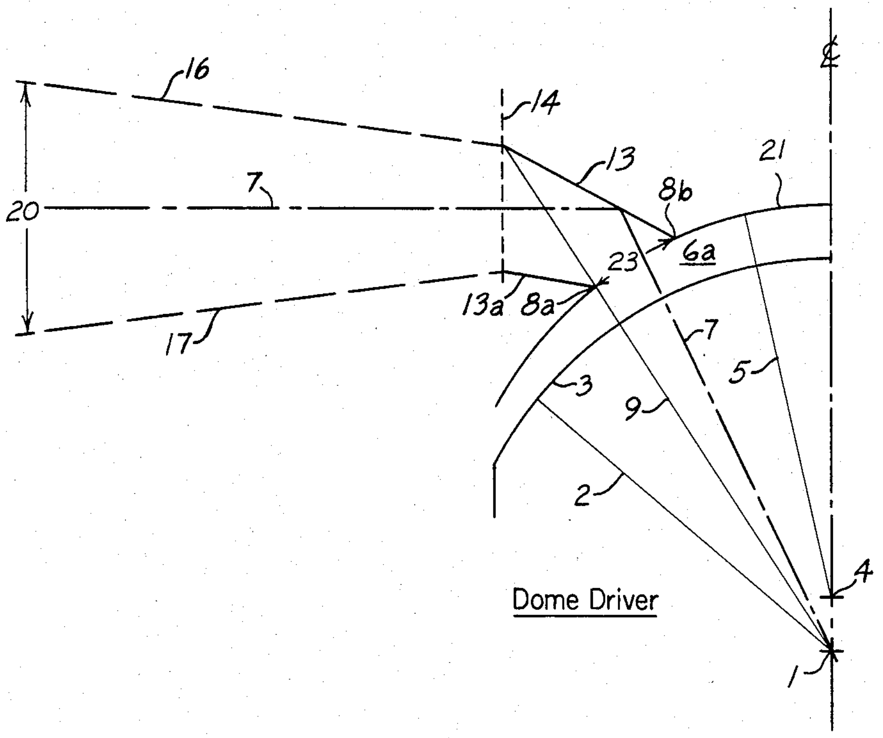
Figure 4B:
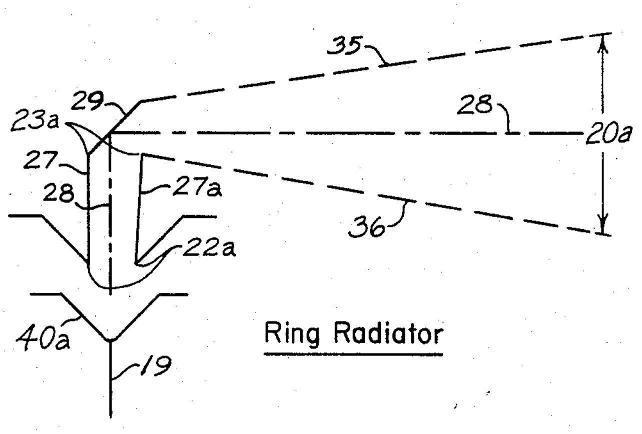

FIG. 3*a* is an enlarged cross-section of the central area of FIG. 2 to show the internal construction of the new radial-reflex high frequency loudspeaker according to this invention; FIG. 3*b* illustrates in cross-section a different embodiment of the high frequency driver assembly;

FIG. 4*a* is a schematic diagram of the throat layout of the radial reflex loudspeaker of FIG. 3*a* using a dome driver;

FIG. 4*b* illustrates the throat layout of the ring radiator driver embodiment of the loudspeaker; these further illustrate the reflection of acoustic energy from a dome driver or ring driver to the horn exit.

Figure 1:
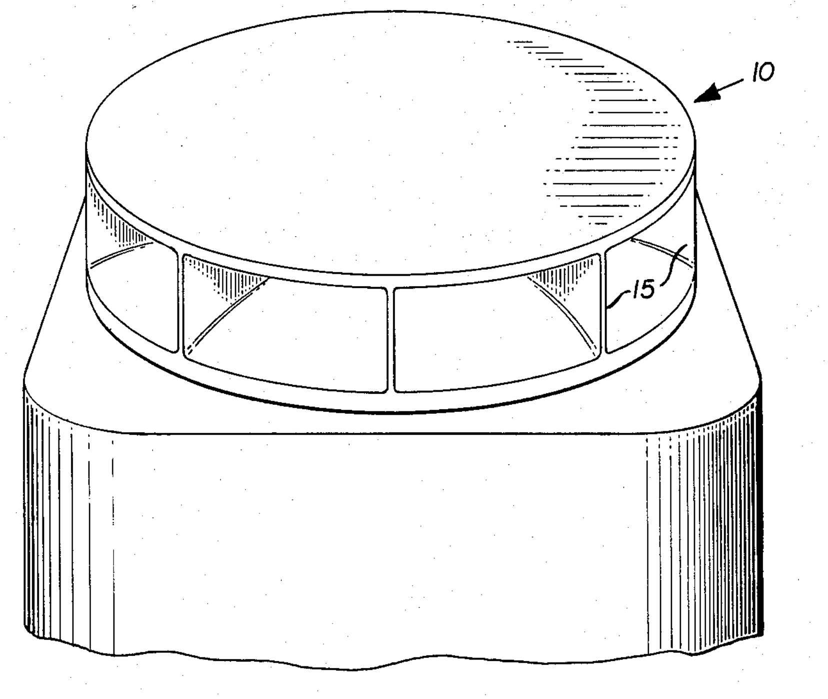
FIG. 1 is a perspective view of the new radial-reflex orthospectral high frequency loudspeaker mechanism of this invention.

The new orthospectral radial-reflex high-frequency horn mechanism 10, described herein and shown in the Figures, consists of an upper circular element 11 and a lower circular element 12. As can be seen in FIG. 1, in perspective, the upper and lower halves 11, 12 are generally convex or may be conical in configuration and face one another. They are spaced apart and held by at least rigid vane-like members 15 disposed at 120° positions about the perimeter of the spaced apart elements 11, 12 to form an annular horn-like aperture 20 to the outside.

In FIG. 2 an elevation of the horn assembly 10 is shown illustrating that the upper and lower elements 11 and 12 may have a exponential curvature. The upper element 11 is, in any case, an annular solid as configured in cross-section of FIG. 3*a* for a dome shaped driver, as further described below. For a ring radiator the annular solid of upper element 11 will have the configuration as at 11*a* in FIG. 3*b*.

The element 11 has a central spheroidal or concave depression 21 which is shaped to match the sphericity of the dome driver 40, forming a compression chamber with a bore 24 in lower element 12 that continues the spherical shape of the concavity 21 across the annular mouth 22 of horn aperture 23.

The element 11*a* has a central cylindrical projection or plug 59 which extends down to the central pole plate 51*a* as shown in FIG. 3*b*. An annular ring aperture about plug 59 formed from elements 11*a* and 12*a* between points 60–61 houses and supports the ring radiator 40*a*.

FIG. 3*a* is a cross-sectional view of the high frequency tweeter and horn assembly of this invention. FIG. 3*a* illustrates the use with a dome diaphragm driver. FIG. 3*b* illustrates the use with a ring driver. In each case the cross-section is that through an annular device.

Considering first, the embodiment of the dome driver assembly of FIG. 3*a*, the dome 40 has depending from it a voice coil assembly 41. The voice coil assembly has a resilient compliance element 42 attached to it which centers the diaphragm 40 and voice coil 41 within annular magnetic gap 55. Magnetic gap 55 is excited by a magnet 54 disposed and centered between pole pieces 51 and 52. The positioning of a voice coil in a magnetic gap in this fashion is well known.

Dome 40 is disposed centrally beneath the concavity 21 in upper horn element 11. This concavity is continued in the lower horn element 12 as indicated at 24. The space above the dome 40 formed by the concavity 21, 24 is a loading cavity upon the domed diaphragm 40. As diaphragm 40 is excited by electrical audio signals applied to voice coil 41, the diaphragm moves vertically up and down on the axis of its center of sphericity, constrained by the resilient compliance element 42. The dome compresses and rarefies the air in the gap between dome 40 and concavity 21, 24. The waves thus generated are forced into and drain out of angled annular frusto-conical horn element 23 via its annular throat gap 22 and reflected from surface R-1 into annular horn 20 formed by horn elements 11 and 12.

The space between the spheroidal surface of dome 40 and the spherical concavity 21, 24 is a compression chamber with a volume predetermined by the effective arc of the vibrating diaphragm and the concavity 21–24 as further discussed below.

In FIG. 3*b* the cross-section shows an alternative embodiment of the driver of this invention. In FIG. 3*b* the moving element instead of a dome is a ring of a V-shaped cross-section 40*a* with the peak 43 of the V pointing downward. Depending from the V-shaped ring 40*a* at the center of its peak is a voice coil assembly 41*a*. The ring 43 is supported resiliently by a compliance element 42*a* which is attached to the inner portion of upper annular horn element 11*a* on the inner diameter at 60 of the ring element compliance 42*a*, while the outer diameter at 61 is attached to the lower horn element 12*a* via the compliance 42*a*. It should be noted that the area between 60 and 61 and 51*a*–52*a* forms an annular ring aperture in which the ring driver 40*a* is supported so as to position voice coil 41*a* thereof in magnetic gap 55*a* formed by the pole pieces 52*a* and 51*a* in the same manner as described hereinabove for the voice coil 41 of dome diaphragm 40. The voice coil 41*a* of ring radiator 40*a* moves vertically in the gap 55*a* as does the voice coil 41 of dome driver 40. The voice coil 41*a* is excited in exactly the same manner as voice coil 41 described above.

Above ring driver 40*a* and formed from the upper horn element 11*a* and lower horn element 12*a* is an annular horn element 23*a* similar to horn element 23 but having a shallower angle with respect to the vertical axis of motion of the ring radiator than the angle described with respect to the dome driver 40.

The annular gap 22*a* forms the throat of annular frusto-conical horn 23*a*. Acoustic energy generated by ring radiator 40*a* excites frusto-conical horn 23*a* as diaphragm 40 excites frusto-conical horn 23. The area above V-shaped ring 40*a* and the mouth aperture 22*a* forms the compression chamber for the ring driver.

In both the dome radiator configuration of FIG. 3*a* and ring radiator configuration of FIG. 3*b* the excitation of horns 23 and 23*a* results in a reflection of the waves into the horn area 20 for the radiator in FIG. 3*a*, or 20*a* for the radiator of FIG. 3*b*. The horn 23 is annular in shape, and waves striking surface R-1 in the annular frusto-conical horn 23 are reflected into annular horn 20*a*.

In annular horn 23*a*, formed by surfaces R-2 and R-3, reflection occurs off of surface R-2 into annular horn 20*a* formed by horn elements 11*a* and 12*a*. Thus, in either instance FIG. 3*a* or FIG. 3*b* the acoustic excitation due to the vertical motion of diaphragm 40 or ring 40*a* is reflected to project that energy outwardly in all directions horizontally perpendicular to the vertical motion of the driver as shown by the dash-dot broken lines 7 in FIG. 4*a* and 28 in FIG. 4*b*.

GEOMETRY OF THE 360° RADIAL REFLEX ORTHOSPECTAL HORN

The two basic patterns of electroacoustic high frequency compression drivers suitable for use with horn loading; the dome driver, used either as a convex or concave diaphragm, and the ring radiator have been described hereinabove.

The layout of the two embodiments is shown in the schematic construction, FIG. 4*a* and FIG. 4*b*. The convex dome is shown in FIG. 4*a*. The ring radiator is shown in FIG. 4*b*. While both types of drivers have been known to the art, they have not been used in the radial reflex acoustically equalized orthospectral horn structure described herein.

The dome driver diaphragm 40 has its center of sphericity on the central axis 1 of the driver, and its radius of sphericity is indicated by line 2. The convex surface of the diaphragm 40 faces a spherical surface 21 of the horn structure, originating at 4 on the central axis and spaced away from the point of origin a distance indicated by line 5. Line 5 and line 2 are of equal length. The space 6*a* between these two spheroidal surfaces is the compression chamber, with a volume predetermined by the effective area of the moving diaphragm and the distance from 1 to 4. A line 7, originating at the dome's center of sphericity 1, enters the throat 8*a*–8*b* of horn 23 at its center. Line 7 is the axial centerline through the horn's throat 8*a*–8*b*. This forms the annular throat gap, of a predetermined area dependent on the dome diaphragm area and the initial electroacoustic transconductance desired by the designer.

The line 13 indicates the locus of a frustoconical reflective surface that originates at one edge of throat gap 8 and extends upwardly at an angle one half of the angle complementary to the angle formed between the axis, 1 of the driver and 7. Line 13 ends at its junction with line 9, originating at center of sphericity 1, of the dome diaphragm and grazing the outer edge of the throat gap at 8*a*. The axial centerline 7 of the horn 23 is reflected by the frusto-conical surface 13 into a horizontal path, because the angle of incidence of line 7 to 13 equals its angle of reflectance. From the intersection of 13 and line 9 a line 14 is dropped parallel to the vertical axis 1 to a point equidistant below the horn center line 7. A line 13*a* from this point to the outer edge of the throat opening 8*a* completes the annular frusto-conical horn opening into the throat of the horn 16, 17. The mouth end of the exponentially flared horn section is indicated at 20.

From the intersection of 13 and 14 the main horn body is shown here as a conical flare 16 extending radially to the predetermined distance of the horn's mouth. This conical flare may be replaced by a multi-flare exponential rate curve to effect the desired band-pass spectral effiency as is discussed below. The flare 16 is duplicated by an opposing symmetrical surface 17 equidistant below the horn's centerline 7.

The alternate driver format, the ring radiator, is shown in FIG. 4*b*. The ring radiator diaphragm 40*a* is V-shaped in cross section, with the voice coil former 19 extending downward from the juncton of the sides. This V-shaped configuration is annular. It centers on the axis of the driver to form a V-shaped ring radiator. On the central axis 28 of the ring radiator diaphragm the horn throat 22*a* is laid out so that the axis 28 thereof bisects the throat gap of a predetermined width to give the total throat slot the venting area required for proper loading of the V-ring radiator to meet the design requirements. The throat slot, formed by the boundaries 27 and 27*a*, extends upward a distance required for mechanical clearance of the driver assembly mounting flange, then encounters a frusto-conical reflective surface 29 which extends across the initial throat passage at an angle of 45°. The axial centerline 28 of the horn 23*a* is reflected from the vertical to the horizontal in accordance with the principle that the angle of incidence equals the angle of reflectance.

As in the case of the dome driver, the main section of the horn 20*a* is defined by a flare, here represented as *conical* in its expansion rate, and shown as originating from the junction of 27 and 29, then extending radially a predetermined distance to the mouth of horn 23*a* at an angle to effect the required equalization of the driver's acoustic output. The opposite side of the horn opening is shown at 35, symmetrically opposite the axis 28 from the flared line 36. As in the case of the dome driver the conical flare 35–36 may be replaced by an exponential multi-flare to effect the acoustic equalization required by the designer to meet the requirements of his system.

HORN FLARE RATES AND ACOUSTICAL OUTPUT EQUALIZATION

Horn loaded loudspeakers are known to have much greater transconductance efficiency than direct drivers. This is because the horn acts as a transformer to match a large mouth area operating at low amplitude to a small throat area operating at high amplitude. The initial conversion efficiency of a horn loaded compression driver is primarily determined by the ratio of the horn throat area to the driver diaphragm area, and the compression chamber volume is the primary factor influencing the high frequency coupling between the driver and the horn. The area of the mouth of the horn is the primary factor in controlling resonances due to reflection. This leaves the flare rate of the horn as the major factor controlling the efficiency of the acoustical output of the horn across the frequency range.

The flare rate of a horn controls the sound pressure response of the horn. A conical, or linear rate, has materially lower efficacy at longer wavelengths than it has at shorter wavelengths, while an exponential, or geometrically progressive flare rate, has materially higher efficacy at long wave lengths down to the region of the cutoff frequency of the horn, and maintains the sound pressure level up to the highest frequencies of which the system is capable, countering the loss of radiated acoustic power by the axial beaming effect of the horn. In a 360° radial horn such as described herein, the beaming effect no longer prevails and the axial pressure response of the horn rolls off in response to the mass control of the acoustic output capability of the driver diaphragm or ring. The axial anechoic pressure response curve becomes virtually identical to the total energy, or acoustic power response curve of the driver and horn. This closely approximates the reverberation chamber frequency response curve of the unit.

Multi-flare rate techniques have been used in the prior art to extend the capability of a horn system at the higher frequencies, but never to effect a uniform acoustic efficiency across the spectral output of a 360° radial-reflex annular horn system. This can be approximated by judicious selection of the flare rate of a conical horn, or by using multiple flare rates to create a varying surge impedance approximating that of a conical flare spectrum.

While the prior art has used one or two flare rate changes to achieve a uniform axial pressure response in conventional horn systems, the rigid requirements of a modern high fidelity loudspeaker system require a progressive change of flare rate across the band-pass ranges of the system to effect a smooth change of acoustic impedance at the throat of the horn. The impedance at the throat of the horn integrates the loading effect of each segment of the length of the horn, be it conical or exponential. Thus a segment having a relatively high frequency cutoff reduces the acoustic resistance at the mouth of the horn for all frequencies below the cutoff frequency of that segment, and the system designer can calculate any horn throat acoustic impedance curve required to match the characteristics of any compression driver to the acoustic output response required of a 360° radial horn as in this invention for any system.

What is claimed as new is:

1. A 360° radial reflex orthospectral expanding acoustical horn loudspeaker for high frequency operation having a wide frequency band of operation and relatively uniform amplitude output over the wide frequency band, said loudspeaker comprising:

a. an electro-acoustic driver coupled into an annular throat having a width approximately a quarter-wavelength of the highest frequency to be reproduced by the loudspeaker;

b. a first annular horn coupled to said throat and disposed at an upward and outward angle to the axis of said driver, said first annular horn expanding at a predetermined first rate;

c. said first annular horn being reflectively coupled into a second annular horn extending on a horizontal axis radially from said first annular horn, said second annular horn having a different expansion rate than said first annular horn, and successive annular elements of said second annular horn being coupled to one another, each successive element having a somewhat larger expansion rate than the expansion rate of the element preceding it, d. whereby acoustic energy over a wide range of high frequencies is emitted from the ultimate one of said annular acoustical horn elements over 360° laterally from said radial orthospectral loudspeaker, with relatively uniform amplitude over said wide range of high frequencies.

2. The radial reflex orthoacoustic horn loudspeaker defined in claim 1 wherein the electro-acoustic driver is a domed diaphragm.

3. The radial reflex orthospectral loudspeaker defined in claim 1 wherein the electro-acoustic driver is of a V-shaped ring radiator configuration.

4. The radial reflex orthospectral expanding acoustical horn loudspeaker defined in claim 1 wherein one surface of said first annular acoustic horn is of a reflective annular frusto-conical configuration and together with its opposing wall forms an annular duct which is conical in cross section.

5. The radial orthospectral expanding acoustical horn loudspeaker defined in claim 1 wherein both said first and second acoustical horn elements are exponentially flared.

6. An electrodynamic high-frequency loudspeaker for radial dispersion over 360° horizontally from the loudspeaker, said loudspeaker comprising:

a. an electrodynamic driver operating on a vertical axis spaced from and acoustically coupled to a ring-configured annular throat, said throat having a cross-section width of $\frac{1}{4}$ wavelength at the highest frequency of operation of the loudspeaker;

b. a first horn of annular configuration coupled to said annular throat, the axis of said annular horn being at an outward upward angle to the vertical axis of operation of said driver; and c. a second horn of annular configuration reflectively coupled to said first horn of annular configuration, the axis of said second annular horn being perpendicular to the vertical axis of motion of said driver extending radially outwardly on a horizontal axis to disperse the acoustic energy generated by said driver horizontally in all directions from the loudspeaker.

7. A 360° reflex annular high frequency acoustical horn loudspeaker of wide band pass and uniform total acoustic spectral energy output capability comprising:

a. a vertically oriented compression driver;

b. an upwardly angled, annular horn throat aperture of predetermined area acoustically coupled to said compression driver;

c. a first annular horn chamber of predetermined conical flare rate adjoining and coupled to said annular horn throat aperture and including an inner frusto-conical reflective surface upwardly angled from the inner edge of said throat aperture to a predetermined length, an outer frusto-conical wall of said first horn chamber extending from said throat aperture to form a horizontal annular mouth opening into a plane perpendicular to the axis of said vertically oriented compression driver;

d. a second annular horn chamber of predetermined length coupled to said annular horizontal mouth and having an axis substantially perpendicular to the axis of said compression driver;

e. said second annular horn chamber having a flare rate related to the flare rate of said first annular horn chamber to equalize the acoustic resistance of said throat aperture to virtual equality at all frequencies in the pass band of said acoustical horn loudspeaker.

8. The 360° reflex annular acoustical horn defined in claim 7 wherein said second horn chamber flare rate is greater than the flare rate of said first horn chamber.

9. The 360° radial reflex annular acoustical horn defined in claim 7 wherein said second horn chamber flare rate equals the flare rate of said first horn chamber.

10. The 360° radial reflex annular horn defined in claim 7 wherein said second horn chamber flare rate is less than said flare angle of said first horn chamber.

11. The 360° reflex annular acoustic horn defined in claim 7 wherein said second annular acoustic horn chamber has an exponential multiflare rate to achieve said equalization.

12. The 360° reflex annular acoustic horn defined in claim 11 wherein the exponential multiflare rate is continuously variable with frequency.

13. The method of providing a multi-section high frequency acoustical horn system for uniform sound dispersion in the horizontal plane with equal transconductance efficiency for all frequencies in its bandpass comprising the steps of:

a. loading the diaphragm of a vertically oriented electroacoustic transducer with a compression chamber of predetermined volume;

b. venting the sound energy generated by said transducer upwardly and outwardly through an annular throat slot of predetermined area;

c. reflecting said sound energy radially outwardly into the horizontal exiting plane of the horn system via a frusto-conical reflective surface of predetermined length originating at the inner edge of said annular throat and extending at an angle mirroring said throat slot along said horizontal exiting plane of the horn system, and together with an opposing wall, forming an initial radial reflex conical expansion chamber;

d. said chamber operating in conjunction with the main body of a radial annular horn, to which said chamber is attached, to modify the acoustic spectral response at said throat gap of said radial-reflex chamber in accordance with the required equalization of the acoustic output of said electroacoustic transducer, e. thereby providing an effectively horizontal distribution of the acoustic energy evenly in all directions normal to the axis of motion of said electroacoustic transducer with equal transconductance over the frequency range of the operation of the system.

* * * * *